United States Patent [19]

Imai, deceased et al.

[11] Patent Number: 5,250,393
[45] Date of Patent: Oct. 5, 1993

[54] METHOD FOR DEVELOPING PRESENSITIZED PLATE FOR USE IN MAKING LITHOGRAPHIC PRINTING PLATE

[75] Inventors: Masanori Imai, deceased, late of Shizuoka, Japan, by Naoko Imai, executor; Keiji Akiyama, Shizuoka, Japan; Tadao Toyama, Shizuoka, Japan; Akinobu Koike, Shizuoka, Japan

[73] Assignee: Fuji Photo Film Co., Ltd., Minami-Ashigara, Japan

[21] Appl. No.: 808,607

[22] Filed: Dec. 17, 1991

[30] Foreign Application Priority Data

Dec. 20, 1990 [JP] Japan ................... 2-404539
Jan. 14, 1991 [JP] Japan ................... 3-2717
Jul. 11, 1991 [JP] Japan ................... 3-171379

[51] Int. Cl.$^5$ .......................... G03F 7/30; G03F 7/021
[52] U.S. Cl. ............................ 430/302; 430/309; 430/325; 430/311; 430/157; 430/175; 430/176
[58] Field of Search ............... 430/302, 309, 331, 325, 430/175, 176, 157

[56] References Cited

U.S. PATENT DOCUMENTS

| 4,259,434 | 3/1981 | Yamasue et al. ............. | 430/302 |
| 5,106,724 | 4/1992 | Nogami et al. ............. | 430/331 |
| 5,149,614 | 9/1992 | Akiyama et al. ............ | 430/302 |

FOREIGN PATENT DOCUMENTS

| 0347245 | 12/1989 | European Pat. Off. . | |
| 0399755 | 11/1990 | European Pat. Off. . | |
| 0415422 | 3/1991 | European Pat. Off. . | |
| 0443742 | 8/1991 | European Pat. Off. . | |
| 3915141 | 11/1989 | Fed. Rep. of Germany . | |
| 2-189544 | 7/1990 | Japan ................... | 430/302 |
| 2-189546 | 7/1990 | Japan ................... | 430/302 |

*Primary Examiner*—Marion E. McCamish
*Assistant Examiner*—Janis L. Dote
*Attorney, Agent, or Firm*—Burns, Doane, Swecker & Mathis

[57] ABSTRACT

A method for preparing a lithographic printing plate comprising the steps of imagewise exposing, to light, a negative-working presensitized plate for use in making a lithographic printing plate which comprises a substrate provided thereon with a light-sensitive layer comprising an aromatic diazonium compound having at least one member selected from the group consisting of carboxyl groups, phenolic hydroxyl groups, sulfonic acid residues, sulfinic acid residues and phosphorus atom-containing oxyacid residues and developing the imagewise exposed presensitized plate with a developer which comprises an aqueous solution of an alkali metal or ammonium silicate having a ratio: $[SiO_2]/[M]$, wherein $[SiO_2]$ and $[M]$ represent the molar concentrations of $SiO_2$ and the alkali metal or ammonia in the developer respectively, ranging from 0.15 to 0.75 and an $SiO_2$ content ranging from 1.0 to 4.0% by weight on the basis of the total weight of the developer to remove the unexposed portion of the light-sensitive layer.

The method for preparing lithographic printing plate makes it possible to treat both negative- and positive-working presensitized plates with a single developer and a single automatic developing machine and can provide a lithographic printing plate having excellent printing durability and free of background contamination. Moreover, the replenisher for developer of the present invention permits repeated development process over a long time period without deteriorating the developability thereof and makes it possible to perform developing process without accompanying any formation of deposits due to the light-sensitive resin components at the bottom of a developing bath.

11 Claims, No Drawings

METHOD FOR DEVELOPING PRESENSITIZED PLATE FOR USE IN MAKING LITHOGRAPHIC PRINTING PLATE

BACKGROUND OF THE INVENTION

1. Field of the Invention

The present invention relates to a method for preparing a lithographic printing plate from a presensitized plate for use in making lithographic printing plates (hereinafter referred to as "PS plate") and more specifically to a method for preparing a lithographic printing plates by developing a positive- or negative-working PS plates with an aqueous solution of an alkali metal silicate substantially free of any organic solvent.

2. Prior Art

PS plates are divided into two groups, i.e., positive-working and negative-working PS plates which are in general developed, respectively, with separate developers each specially prepared therefor. For this reason, two kinds of developers must be used when it is needed to simultaneously develop these two kinds of PS plates. In addition, if large amounts of these two kinds of PS plates must be developed, the use of two separate automatic developing machines are required. This is economically unfavorable because of, for instance, expenses and a large area required for the installation of these machines.

Alternatively, if these two kinds of PS plates are processed in a common automatic developing machine, the developer must be exchanged depending on the kinds of these PS plates to be processed. This leads to the reduction of operation efficiency and is likewise economically unfavorable.

To solve such problems, there haves been proposed methods for developing these two kinds of PS plates with a common developer, but they have still been insufficient. This is perhaps due to the following reasons. In general, the developers for positive-working PS plates having a light-sensitive layer, which comprises, for instance, an o-quinonediazide compound and an alkali-soluble resin, are alkaline aqueous solutions mainly comprising silicates and having a pH of not less than 12. However, negative-working PS plates comprising water-insoluble diazo resins and alkali-soluble resins cannot be developed at all or only partially developed with these developers. The light-sensitive layer remaining on the developed PS plates becomes a cause of background contamination during printing. On the other hand, positive-working PS plates likewise insufficiently or only partially developed with a developer for negative-working PS plate and this likewise becomes a cause of background contamination during printing. Moreover, the light-sensitive layer of positive working PS plate is possibly attacked with, for instance, solvents present in a certain kind of developers for negative-working PS plate. In other words, those developer have only limited development tolerancy and the use of such a common developer results in the reduction of ink receptivity and printing durability of the resulting lithographic printing plates.

To solve such problems, many attempts have been made for the development of a method for developing both positive- and negative working PS plates with a common developer, but any satisfactory methods have not yet been proposed. More specifically, when positive working PS plates are developed with a developer composition for negative-working PS plate, the image portions of the positive-working PS plates are partially liquated out and the resulting lithographic printing plates have insufficient printing durability and low ink adhesion, while if negative-working PS plates are developed with a developer composition for positive-working PS plate, the non-image areas thereof cannot completely be removed and this becomes a cause of background contamination during printing.

Under such circumstances, for instance, EP 0399755A and EP 0415422A disclose a method for developing a negative-working PS plate which comprises an alkaline water soluble binder and an alkaline water-soluble diazo resin with a developer for positive-working PS plate.

When the foregoing negative-working PS plate is developed with a conventional developer for positive-working PS plate, a replenisher composition and a developing method such as disclosed in U.S. Pat. No. 4,259,434, the developability of the negative-working PS plate is relatively good in the early stage of the development. However, in the development over a long period of time with the addition of a replenisher, the non-image area is not necessarily be removed completely because of a high ionic strength of the developer and the influence of negative-working light-sensitive resin components liquated out or the like. Further, the non-image area is slightly colored and the resulting lithographic printing plate causes background contamination during printing. Moreover, a part of the light-sensitive resin components which cannot be dissolved in the developer is deposited on the bottom of the developing bath and this becomes a cause of clogging of spray pipes and nozzles.

In addition, Japanese Unexamined Patent Publication (hereinafter referred to as "J.P. KOKAI") No. Sho 64-56442 discloses a method for developing, with a developer for positive-working PS plate, a negative-working PS plate having a light-sensitive layer which comprises an alkali-soluble polymer, a monomer and a photopolymerization initiator. However, the monomer included in this light-sensitive layer is not substantially dissolved in an alkaline developer. As a result, insolubles are accumulated in the developer and an overcoat of, for instance, polyvinyl alcohol for preventing oxygen-blocking is dissolved in the developer as the quantity of processed PS plates increases. This leads to a remarkable increase in the viscosity of the developer and a decrease of the developing capacity thereof.

Further, J.P. KOKAI Nos. Hei 2-220062, Hei 2-219060, Hei 2-217859 and Hei 2-189544 disclose methods for developing a negative-working PS plate comprising a diazo resin and a binder with an alkaline aqueous solution having a pH of not less than 12. However, the development of the PS plates comprising diazo resins and binders with a high pH aqueous solution suffers from various problems such as formation of lithographic printing plates having low printing durability and low ink receptivity due to penetration of a developer into the image area of the printing plates.

Examples of negative-working light-sensitive compositions are those comprising polymers carrying dimethylmaleimido groups as photocrosslinkable polymers as disclosed in U.S. Pat. No. 4,079,041 and those comprising the foregoing polymer and diazo resins as disclosed in U.S. Pat. No. 4,845,009 in addition to the aforementioned compositions.

However, most of PS plates obtained from these light-sensitive compositions are developed with developers containing organic solvents. This is because, if they are developed with developers which comprise a silicate, have a high pH and are free of organic solvents, the developability thereof is greatly lowered and hence the development insufficiently proceeds, while if the developability of the polymers used in PS plates is improved, the sensitivity of the PS plates is lowered and the printing durability of the resulting lithographic printing plate is impaired.

SUMMARY OF THE INVENTION

Accordingly, a first object of the present invention is to provide a method which can solve the foregoing problems and which comprises developing both negative- and positive-working PS plate with an aqueous solution containing an alkali metal or ammonium silicate and substantially free of organic solvents to thus give a lithographic printing plate which has excellent printing durability and does not cause background contamination.

A second object of the present invention is to provide a developing replenisher composition which can be used in the foregoing method for preparing a lithographic printing plate, wherein excellent developing ability can be maintained even if it is repeatedly used in development processing over a long time period and any formation of deposits (viz., sludge) of light-sensitive resin components and the like is observed in the developing bath.

The first object of the present invention can be achieved by providing a method for preparing a lithographic printing plate which comprises the steps of imagewise exposing, to light, a negative-working presensitized plate for use in making a lithographic plinting plate which comprises a substrate provided thereon with a light-sensitive layer comprising an aromatic diazonium compound having at least one member selected from the group consisting of carboxyl groups, phenolic hydroxyl groups, sulfonic acid residues, sulfinic acid residues and phosphorous atom-containing oxyacid residues and developing the imagewise exposed PS plate with a developer which comprises an aqueous solution containing an alkali metal or ammonium silicate having a ratio: $[SiO_2]/[M]$, wherein $[SiO_2]$ and $[M]$ represent the molar concentrations of $SiO_2$ and the alkali metal or ammonia in the developer respectively, ranging from 0.15 to 0.75 and an $SiO_2$ content ranging from 1.0 to 4.0% by weight on the basis of the total weight of the developer to remove unexposed areas of the light-sensitive layer.

The second object of the present invention can be achieved by the foregoing method for preparing a lithographic printing plate according to the present invention, wherein numerous sheets of the imagewise exposed negative-working PS plate are developed through repeated use of a predetermined volume of the foregoing developer and the activity of the developer deteriorated during the development is compensated by the addition of a developing replenisher having a ratio: $[SiO_2]/[M]$ ranging from 0.15 to 0.50 and an $SiO_2$ content ranging from 1.0 to 3.0% by weight on the basis of the total weight thereof, to the developer.

The replenisher is added for compensating the components (mainly alkali components) of the developer consumed through the processing of the PS plates, the developer adhered to and carried over by the processed PS plates and the alkali components neutralized with carbon dioxide in the air. Therefore, it must be an aqueous solution of an alkali metal silicate having a composition capable of maintaining a constant composition of the developer which varies with an increase in the quantity of the PS plate to be processed and with time.

The replenisher composition of the present invention has a $[SiO_2]/[M]$ and an $SiO_2$ content each falling within the lower part of the range of $[SiO_2]/[M]$ or the $SiO_2$ content of the developer used in the foregoing method for preparing a lithographic printing plate according to the present invention and thus can maintain the desired alkalinity of the developer used in the method.

DETAILED DESCRIPTION OF THE PREFERRED EMBODIMENTS

The present invention will hereunder be described in more detail.

The developer which mainly comprises an alkali metal or ammonium silicate and is used in the method for preparing a lithographic printing plate according to the present invention has a ratio: $[SiO_2]/[M]$ ranging from 0.15 to 0.75, preferably 0.25 to 0.50 and an $SiO_2$ content ranging from 1.0 to 4.0% by weight and preferably 1.0 to 3.0% by weight. The use of such a developer makes it possible to improve the developability of negative-working PS plates and the printing durability of the resulting lithographic printing plates and further to develop both negative- and positive-working PS plates with a common developer. In other words, both negative- and positive-working PS plates can be developed with a single common developer and a single automatic developing machine to give lithographic printing plates free of background contamination and having excellent printing durability.

If the ratio: $[SiO_2]/[M]$ of the developer exceeds 0.75, the developing ability thereof for negative-working PS plates is lowered and the problem of background contamination during printing cannot be solved, deposits due to dissolution of the components of the negative-working light-sensitive layer are easily formed and the processing ability of the developer is lowered. On the other, if the ratio is less than 0.15, image portions are easily be peeled off from a substrate although the developability for negative-working PS plates is improved and the problem of background contamination during printing can be solved. Further, the stability of the developed positive-working PS plates is greatly impaired and correspondingly the images are peeled off within a short period of time. Moreover, non-image areas and the back face of an aluminum substrate are excessively etched.

If the $SiO_2$ content of the developer is more than 4% by weight, the ability thereof for developing negative-working PS plates is likewise lowered, the problem of background contamination during printing cannot be solved and deposits of the components of the light-sensitive layer dissolved out are easily formed. On the other hand, if it is less than 1.0% by weight, the buffering capacity of the developer is reduced, thereby pH thereof is lowered due to $CO_2$ in the air and thus a uniform alkalinity thereof cannot steadily be maintained. In addition, positive-working PS plates are also insufficiently developed and accordingly background contamination during printing is caused.

Examples of alkali metal silicates usable in the invention include sodium silicate, potassium silicate, lithium silicate and ammonium silicate which may be used alone or in combination, with potassium silicate being particularly preferred. When potassium silicate is used in combination with other silicates, it is preferably used in an amount of at least 20% by weight on the basis of the total weight of the alkali metal silicates. The developer may optionally comprise other alkaline agents other than those listed above.

Specific examples of other alkaline agents are inorganic alkaline agents such as potassium hydroxide, sodium hydroxide, lithium hydroxide, sodium tertiary phosphate, sodium secondary phosphate, ammonium tertiary phosphate, ammonium secondary phosphate, sodium metasilicate, sodium bicarbonate, sodium borate, ammonium borate and ammonia: and organic amine compounds such as monomethylamine, dimethylamine, trimethylamine, monoethylamine, diethylamine, triethylamine, monoisopropylamine, diisopropylamine, n-butylamine, monoethanolamine, diethanolamine, triethanolamine, monoisopropanolamine, diisopropanolami ne, ethyleneimine, ethylenediamine and pyridine, which may be used alone or in combination.

The developer used in the invention may optionally comprise organic solvents and/or various surfactants. Examples of surfactants usable include anionic surfactants such as $C_8$ to $C_{22}$ higher alcohol sulfuric acid ester salts, e.g., sodium salt of laurylalcohol sulfate, sodium salt of octylalcohol sulfate, ammonium salt of laurylalcohol sulfate and disodium alkylsulfate; fatty acid alcohol sulfuric acid ester salts, e.g., sodium salt of acetylalcohol sulfate; alkylarylsulfonic acid salts, e.g., sodium dodecylbenzenesulfonate, sodium isopropylnaphthalenesulfonate and sodium m-nitrobenzenesulfonat e; sulfonates of alkylamides, e.g., $C_{17}H_{33}CON(CH_3)CH_2CH_2SO_3Na$; and sulfonate salts of dibasic fatty acid esters, e.g., sodium dioctyl sulfosuccinate and sodium dihexyl sulfosuccinate; amphoteric surfactants such as alkylcarboxybetaines, alkylaminocarboxylic acids, alkylimidazolines; nonionic surfactants as those disclosed in, for instance, J.P. KOKAI Nos. Sho 59-84241, Sho 62-168160 and Sho 62-175758 and organic boron compounds as disclosed in Japanese Examined Patent Publication (hereinafter referred to as "J.P. KOKOKU") No. Hei 1-57895 (=U.S. Pat. No. 4,500,625); and cationic surfactants such as those disclosed in, for instance, J.P. KOKAI No. Sho 62-175757.

The developer may suitably comprise these surfactants in an amount ranging from 0 to 5% by weight on the basis of the total weight of the developer practically used.

Organic solvents suitably used in the invention are selected from those having a solubility in water of not more than about 10% by weight and preferably not more than 2% by weight. Specific examples thereof are 1-phenylethanol, 2-phenylethanol, 3-phenylpropanol-1, 4-phenylbutanol-1, 4-phenylbutanol-2, 2-phenylbutanol-1, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexano 1, 4-methylcyclohexanol and 3-methylcyclohexanol.

The developer may suitably comprise these organic solvents in an amount ranging from 1 to 5% by weight on the basis of the total weight of the developer. The amount of the organic solvents closely relates to that of the surfactants and it is thus preferred to increase the amount of the surfactant along with that of the organic solvents.

Further, the developer may optionally comprise other additives such as alkali-soluble mercapto compounds and/or thioether compounds, water-soluble reducing agents, antifoaming agents and agents for softening hard water.

Examples of agents for softening hard water include polyphosphates such as $Na_2P_2O_7$, $Na_5P_3O_3$, $Na_2P_3O_9$, $Na_2O_4P(NaO_3P)PO_3Na_2$, Calgon (sodium polymetaphosphate); aminopolycarboxylic acids and salts thereof such as ethylenediaminetetraacetic acid and potassium and sodium salts thereof, diethylenetriaminepentaacetic acid and potassium and sodium salts thereof, triethylenetetraminehexaacetic acid and potassium and sodium salts thereof, hydroxyethylethylenediaminetriacetic acid and potassium and sodium salts thereof, nitrilotriacetic acid and potassium and sodium salts thereof, 1,2-diaminocyclohexanetetraacetic acid and potassium and sodium salts thereof and 1,3-diamino-2-propanoltetraacetic acid and potassium and sodium salts thereof; and organic phosphonic acids and salts thereof such as ethylenediaminetetra(methylenephosphoni c acid) and potassium and sodium salts thereof. The optimum amount of these agents for softening hard water varies depending on the hardness of water and the amount thereof used, but the amount thereof in general ranges from 0.01 to 5% by weight, preferably 0.01 to 0.5% by weight on the basis of the weight of the developer practically used.

Examples of water-soluble reducing agents are phenolic compounds such as hydroquinone, 2-methylresorcin, 2 hydroxy-3-naphtoic acid and methoxyquinone; amine compounds such as phenylenediamine and phenylhydrazine; sulfites such as sodium sulfite, potassium sulfite and sodium hydrogen sulfite; phosphites such as potassium phosphite and potassium hydrogen phosphite; sodium thiosulfate and sodium dithionite. These water-soluble reducing agents are used in an amount of 0.01 to 10% by weight on the basis of the total weight of the developer.

The alkali-soluble mercapto compounds and/or thioether compounds are preferably those having at least one mercapto and/or thioether groups and at least one acid group in the molecule and more preferably those having at least one mercapto and carboxyl groups in the molecule. Specific examples thereof are those described in German Patent No. 3913183A and preferred are thiosalicylic acid, N-(2,3-dimercaptopropiony l)glycine, 2-(1,2-dicarboxyethylthio)-5-mercapto-1,3,4-thiadiazole, 4-mercaptobenzenesulfonic acid, N-(2-mercapto-2-methylpropionyl)cysteine and cysteine. They can be used in the developer composition in an amount ranging from 0.001 to 10% by weight, preferably 0.01 to.5% by weight.

There have been known various methods for developing imagewise exposed PS plates with a developer explained above, for instance, those in which a developer is repeatedly used such as a method which comprises charging the developer in a tank and passing PS plates through the tank while dipping them in the developer, or spraying the PS plates with the developer in the tank as disclosed in U.S. Pat. No. 4,952,958; and those in which a developer is used only once and then disposed, such as a method in which the developer is applied onto the plate surface in a desired amount to develop the plate and disposing the used developer as disclosed in J.P. KOKAI No. Sho 61-243455 and U.S. Pat. No. 4,837,131, but the method in which the developer is repeatedly used is preferably adopted in the present invention. In this case, a developer replenisher is preferably added to the developer intermittently or continuously.

The developing replenisher composition of the present invention is preferably used as a replenisher for developer in the foregoing method. The replenisher composition of the present invention is an aqueous solution of an alkali metal or ammonium silicate having a ratio: [SiO$_2$]/[M] ranging from 0.15 to 0.50 and an SiO$_2$ content ranging from 1.0 to 3.0% by weight. If such a replenisher composition of the invention is used in the plate making method of the invention, the alkalinity of the developer can be maintained within a desired range even when the developer is repeatedly used in the developing process over a long time period.

Silicate compounds and alkaline agents usable in the developer replenisher composition of the invention may preferably be those listed above in connection with the developer. As to other additives, the same compounds can be used in the amounts similar to those discussed above in connection with the developer.

Methods for supplementing the replenisher are detailed in, for instance, U.S. Pat. Nos. 4,259,434 and 4,537,496, G.B. Patent Nos. 2,046,931B and 2,208,249A, EP 0347245A and J.P. KOKAI No. Hei 1-180548. These methods can suitably be used in the present invention.

The replenishers disclosed in these patents can likewise be used in the method for preparing a lithographic printing plate according to the present invention.

Unexposed areas of negative-working PS plates or exposed areas of positive-working PS plates are removed through the development process. After the development process, the developed PS plates may, if necessary, be subjected to a desensitization treatment optionally after washing with water, or a treatment with an aqueous solution containing an acid, or further a desensitization treatment after the treatment with an aqueous solution containing an acid. A gumming solution is applied onto the developed PS plate to give a lithographic printing plate.

Desensitization gums to be applied, if necessary, in the final step of the production of the light-sensitive lithographic plate are preferably those described in J.P. KOKOKU Nos. Sho 62-16834 (=U.S. Pat. No. 4,348,954), Sho 62-25118 (=U.S. Pat. No. 4,268,613) and Sho 63-52600 and J.P. KOKAI Nos. Sho 62-7595 (=U.S. Pat. No. 4,731,119), Sho 62-11693 (=U.S. Pat. No. 4,719,172) and Sho 62-83194 (=U.S. Pat. No. 4,762,772).

After completion of the development, unrequired areas in the image areas can be deleted with a commercially available deletion liquid or by rubbing with a stone rod.

PS plates to which the method of the present invention can be applied will hereunder be described in detail.

The light-sensitive layer of negative-working PS plate to which the method of the present invention can be applied comprises an aromatic diazonium compound having at least one member selected from the group consisting of carboxyl groups, phenolic hydroxyl groups, sulfonic acid residues, sulfinic acid residues and phosphorus atom-containing oxyacid residues.

Preferred light-sensitive layers for negative- and positive-working PS plates usable in the present invention are as follows:

A. Negative-Working Light-Sensitive Composition

A-1. Light-sensitive layer comprising an alkaline water-soluble or -swellable photocrosslinkable polymer having maleimido groups on the side chains, a sensitizer and a co-condensed diazo resin having repeating units derived from an aromatic compound having at least one carboxyl group and those derived from an aromatic diazonium compound Examples of the polymers having maleimido groups on the side chains are polymers having, on the side chains, maleimido groups represented by the following general formula (A):

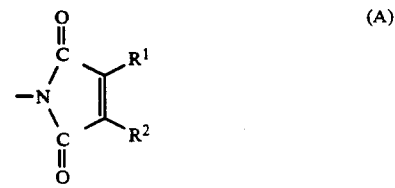

wherein R$^1$ and R$^2$ each independently represents an alkyl group having at most 4 carbon atoms or they may form a 5- or 6-membered carbon ring together with the carbon atoms to which they are bonded, as disclosed in J.P. KOKAI No. Sho 52-988 (corresponding to U.S. Pat. No. 4,079,041), German Patent No. 2,626,769, EP Nos. 21,019 and 3,522 and Die Angewandte Makromolekulare Chemie, 115 (1983) pp. 163–181; and polymers having, on the side chains, maleimido groups represented by the following general formula (B):

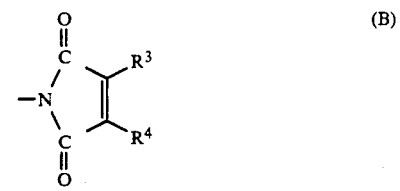

wherein R$^3$ represents an aromatic group and R$^4$ represents a hydrogen or halogen atom or an alkyl or cyano group, as disclosed in J.P. KOKAI Nos. Sho 49-128991, Sho 49-128992, Sho 49-128993, Sho 50-5376, Sho 50-5377, Sho 50-5378, Sho 50-5379, Sho 50-5380, Sho 53-5298, Sho 53-5299, Sho 53-5300, Sho 50-50107, Sho 51-47940, Sho 52-13907, Sho 50-45076, Sho 52-121700, Sho 50-10884 and Sho 50-45087 and German Patent Nos. 2,349,948 and 2,616,276. These polymers have at least two maleimido groups per molecule on the side chains on the average.

These polymers having, on the side chains, maleimido groups can be made alkaline water-soluble or swellable by incorporating acid groups into these polymers.

Specific examples of such acid groups are carboxyl group, sulfonate residue, phosphate residue, phosphonate residue, alkali metal or ammonium salts thereof and those having a pKa value ranging from 6 to 12 with respect to dissociation in an alkaline water, e.g., —SO$_2$NHCO—, —CONHCO—, —SO$_2$NHCOO— and 4-hydroxyphenyl group. The photocrosslinkable polymers used in the invention can easily be obtained by copolymerizing these acid group-containing monomers with maleimido group-containing monomers in a molar ratio ranging from, for instance, 10/90 to 50/50 and preferably 20/80 to 40/60.

The acid value of the acid group-containing maleimide polymers preferably ranges from 30 to 300 and more preferably 50 to 250. In this respect, preferred acid group-containing monomers copolymerizable with the maleimido group containing monomers are, for instance, vinyl monomers having a carboxyl group such as acrylic acid and methacrylic acid, maleic anhydride and itaconic anhydride.

Among these acid group-containing polymers, useful are copolymers of N-[ω-(methacryloyloxy)alkyl]-2,3-dimethylmaleimide with (meth) acrylic acid as disclosed in Die Angewandte Makromolekulare Chemie, 128 (1984) pp. 71-91. Moreover, multicomponent polymers can easily be prepared by copolymerizing these monomers with other vinyl monomers as third components depending on purposes. For instance, if alkyl (meth) acrylates whose homopolymer has a glass transition temperature of not more than room temperature are used as the third vinyl monomer components, flexibility can be imparted to the resulting copolymers.

These polymers used in the invention preferably have a weight average molecular weight of not less than 1,000, preferably 10,000 to 500,000 and most preferably 20,000 to 300,000.

These photocrosslinkable polymers are used in the light-sensitive layer in an amount ranging from 10 to 99% by weight (hereinafter referred to as simply "%"), preferably 50 to 99% on the basis of the total weight of the light-sensitive layer.

The co-condensed diazo resins used in the invention comprise repeating units derived from an aromatic compound having at least one carboxyl group and an aromatic diazonium compound represented by the following general formula (C):

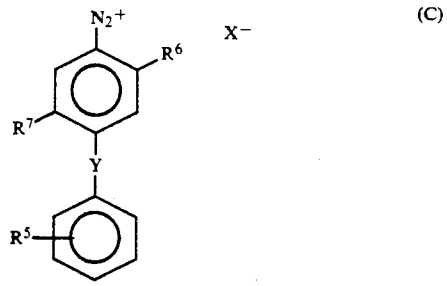

In the formula (C), $R^5$ represents a hydrogen atom or an alkyl, alkoxy, hydroxyl, carboxyester or carboxyl group, preferably a hydrogen atom, an alkyl group having 1 to 5 carbon atoms or a hydroxyl group. $R^6$ represents a hydrogen atom or an alkyl or alkoxy group, preferably a hydrogen atom or an alkoxy group. $R^7$ represents a hydrogen atom or an alkyl or alkoxy group, preferably a hydrogen atom.

$X^-$ represents an anion, preferably an anion derived from inorganic or organic acid having a pKa of not more than 4. Specific examples thereof are anions or mixture thereof derived from hydrohalogenic acids such as hydrofluoric acid, hydrochloric acid, hydrochloric acid-zinc chloride complex and hydrobromic acid, sulfuric acid, nitric acid, phosphoric acid (pentavalent phosphorus-containing acid), in particular orthophosphoric acid, inorganic iso- and heteropoly-acids such as phosphotungstic acid and phosphomolybdic.acid, fatty acids or aromatic phosphonic acids or half esters thereof, arsonic acid, phosphinic acid, fluorocarboxylic acids such as trifluoroacetic acid, amidosulfonic acid, selenic acid, fluoroboric acid, hexafluorophosphoric acid, perchloric acid, aliphatic and aromatic sulfonic acids including fluoroalkanesulfonic acids such as methanesulfonic acid and trifluoromethanesulfonic acid, laurylsulfonic acid, dioctylsulfosuccinic acid, dicyclohexylsulfosuccinic acid, camphorsulfonic acid, tolyloxy-3-propanesulfonic acid, nonylphenoxy-3-propanesulfonic acid, nonylphenoxy-4-butanesulfonic acid, dibutylphenoxy-3-propanesulfonic acid, diamylphenoxy-3-propanesulfonic acid, dinonylphenoxy-3-propanesulfonic acid, dibutylphenoxy 4-butanesulfonic acid, dinonylphenoxy-4-butanesulfonic acid, benzenesulfonic acid, toluenesulfonic acid, mesitylenesulfonic acid, p-chlorobenzenesulfonic acid, 2,5-dichlorobenzenesulfonic acid, sulfosalicylic acid, 2,5-dimethylbenzenesulfonic acid, p-acetylbenzenesulfonic acid, 5-nitro-o-toluenesulfonic acid, 2-nitrobenzenesulfonic acid, 3-chlorobenzene-sulfonic acid, 3-bromobenzenesulfonic acid, 2-chloro-5-nitrobenzenesulfonic acid, butylbenzenesulfonic acid, octylbenzenesulfonic acid, dodecylbenzenesul fonic acid, butoxybenzenesulfonic acid, dodecyloxybenzenesulfonic acid, 2-methoxy-4-hydroxy-5-benzoylbenzene-sulfonic acid, isopropylnaphthalene sulfonic acid, butylnaphthalenesulfonic acid, hexylnaphthalenesulfonic acid, octylnaphthalenesulfonic acid, butoxynaphthalenesulfonic acid, dodecyloxynaphthalenesulfonic acid, dibutylnaphthalenesulfonic acid, dioctylnaphthalenesulfonic acid, triisopropylnaphthalenesulfonic acid, tributylnaphthalenesulfonic acid, 1-naphthol-5-sulfonic acid, naphthalene-1-sulfonic acid, naphthalene-2-sulfonic acid, 1,8-dinitronaphthalene-3,6-disulfonic acid, 4,4'-diazido-stilbene-3,3'-disulfonic acid, 1,2-naphthoquinone-2-diazido-4-sulfonic acid and 1,2-naphthoquinone-2-diazido-5-sulfonic acid.

Among these anions, particularly preferred are those derived from dodecylbenzenesulfonic acid, dibutylnaphthalenesulfonic acid, methanesulfonic acid, 2-methoxy-4-hydroxy-5-benzoylbenzenesulfonic acid and hexafluorophosphoric acid.

Y represents —NH—, —O— or —S— and preferably —NH—.

Specific examples of the aromatic diazonium compounds represented by the formula (C) include salts of 4-diazodiphenylamine, 4'-hydroxy-4-diazodiphenylamine, 4'-methyl-4-diazodiphenylamine, 4'-ethyl-4-diazodiphenylamine, 4'-n-propyl-4-diazodiphenylamine, 4'-isopropyl-4-diazodiphenylamine, 4'-n-butyl-4-diazodiphenylamine, 4'-hydroxymethyl-4-diazodipheynlamine, 4'-β-hydroxyethyl-4-diazodiphenylamine, 4'-γ-hydroxypropyl-4-diazodiphenylamine, 4'-methoxymethyl-4-diazodiphenylami ne, 4'-ethoxymethyl-4-diazodiphenylamine, 4'-β-methoxymethyl-4-diazodiphenylamine, 4'-β-ethoxymethyl-4-diazodiphenylamine, 4'-carboxy-4-diazodiphenylamine, 3-methyl-4-diazodiphenylamine, 3-ethyl-4-diazodiphenylamine, 3'-methyl-4-diazodiphenylamine, 3,3'-dimethyl-4-diazodiphenylamine, 2'-carboxy-4-diazodiphenylamine, 4-diazodiphenyl ether, 4'-methyl-4-diazodiphenyl ether, 3,4'-dimethyl-4 -diazodiphenyl ether, 4'-carboxy-4-diazodiphenyl ether, 3,3'-dimethyl-4-diazodiphenyl ether, 4-diazodiphenylsulfide and 4'-methyl-4-diazodiphenylsulfide.

Among these, 4-diazodiphenylamine salts and 4-diazo-3-methoxydiphenylamine salts are particularly preferred aromatic diazonium compound.

The foregoing aromatic compound having at least one carboxyl group are those comprising at least one aromatic ring carrying a carboxyl group in the molecule. In this case, a part of the carboxyl groups may be linked to the aromatic rings. The aromatic rings are preferably phenyl and naphthyl groups. The carboxyl groups may be bonded to the aromatic rings directly or through a connecting group, the latter being preferred. The number of the carboxyl groups bonded to aromatic groups preferably ranges from 1 to 3 per ring. Examples of the connecting groups include alkylene groups having 1 to 4 carbon atoms.

The foregoing aromatic compounds must have at least two non-substituted sites on at least one aromatic ring of the aryl group in order to condense the aromatic compounds with aldehydes or ketones.

Specific examples of aromatic compounds having carboxyl groups in the molecule include salicylic acid, 4-methylsalicylic acid, 6-methylsalicylic acid, 4-ethylsalicylic acid, 6-propylsalicylic acid, 6-laurylsalicylic acid, 6-stearylsalicylic acid, 4,6-dimethylsalicylic acid, p-hydroxybenzoic acid, 2 methyl-4-hydroxybenzoic acid, 6-methyl 4-hydroxybenzoic acid, 2,6-dimethyl-4-hydroxybenzoic acid, 2,4-dihydroxybenzoic acid, 2,4-dihydroxy 6-methylbenzoic acid, 2,6-dihydroxybenzoic acid, 2,6-dihydroxy-4-methylbenzoic acid, 4-chloro-2,6-dihydroxybenzoic acid, 4-methoxy-2,6 dioxybenzoic acid, gallic acid, phloroglucin carboxylic acid, 2,4,5-trihydroxybenzoic acid, m-galloylgallic acid, tannic acid, m-benzoylgallic acid, m (p-toluyl) gallic acid, protocatechuoyl-gallic acid, 4,6-dihydroxyphthalic acid, (2,4-dihydroxyphenyl)acetic acid, (2,6-dihydroxyphenyl)acetic acid, (3,4,5-trihydroxyphenyl)acetic acid, phenoxyacetic acid, p-hydroxymethylbenzoic acid, p-hydroxyethylbenzoic acid, 4-(p-hydroxyphenyl)-methylbenzoic acid, 4-(o-hydroxybenzoyl)benzoic acid, 4-(2,4-dihydroxybenzoyl)benzoic acid, 4-(p-hydroxyphenoxy)benzoic acid, 4-(p-hydroxyanilino)benzoic acid, bis(3-carboxy-4-hydroxyphenyl)amine, 4-(p-hydroxyphenylsulfonyl)benzoic acid, 4-(p-hydroxyphenylthio)benzoic acid, p-methoxybenzoic acid, 2,4-dimethoxybenzoic acid, 2,4-dimethylbenzoic acid, p-phenoxybenzoic acid, p-methoxyphenylacetic acid, 4-anilinobenzoic acid, 4-(m-methoxyanilino)benzoic acid, 4-(p-methoxybenzoyl)benzoic acid, 4-(p-methylanilino)benzoic acid and 4-phenylsulfonylbenzoic acid. Among these, particularly preferred are 2,4-dimethoxybenzoic acid, p-phenoxybenzoic acid, 4-anilinobenzoic acid, 4-(m-methoxyanilino)benzoic acid, 4-(p-methylanilino)benzoic acid, salicylic acid, p-hydroxybenzoic acid, 2,4-dihydroxybenzoic acid, gallic acid, phloroglucin carboxylic acid, phenoxyacetic acid and 4-(p-hydroxyanilino)benzoic acid.

The co-condensed diazo resins having repeating units derived from an aromatic compound carrying at least one carboxyl group and an aromatic diazonium compound can be obtained by polycondensing the aromatic diazonium compounds, the carboxyl group-containing aromatic compounds and aldehydes such as paraformaldehyde, acetaldehyde and benzaldehyde or ketones such as acetone and acetophenone in sulfuric acid, phosphoric acid or hydrochloric acid in the known manner as disclosed in, for instance, Photo. Sci. Eng., 17 (1973) p. 33 and U.S. Pat. Nos. 2,063,631 and 2,679,498.

These carboxyl group-containing aromatic compounds, aromatic diazonium compounds and aldehydes or ketones can be used in any combination and each component can also be used in combination. Further, the co-condensation may be performed in the presence of phenols free of carboxyl groups co-condensable with the foregoing compounds.

The molar ratio of the carboxyl group-containing aromatic compound to the aromatic diazonium compound used in the co-condensation ranges from 1:0.1 to 0.1:1, preferably 1:0.2 to 0.2:1, more preferably 1:0.5 to 0.2:1. Moreover, the molar ratio of the sum of the carboxyl group-containing aromatic compound and the aromatic diazonium compound to the aldehyde or ketone generally ranges from 1:0.6 to 1:1.2 and preferably 1:0.7 to 1:1.5. The co-condensation reaction is carried out at a low temperature for a short period of time, for instance, about 3 hours to give desired co-condensed diazo resins.

Specific examples of the co-condensed diazo resins include salicylic acid/4-diazodiphenylamine.hexafluorophosphate/formaldehyde resin, 4-methylsalicylic acid/4-diazo-4'-methyldiphenylamine. hexafluorophosphate/formaldehyde resin, p-hydroxybenzoic acid/4-diazodiphenylamine. hexafluorophosphate/formaldehyde resin, p-hydroxybenzoic acid/4-diazo-3-methyldiphenylamine.hexafluorophosphate/formaldehyde resin, 9allic acid/4-diazo-4'-ethyldiphenylamine.2-hydroxy-4-methoxybenzophenone-5-sulfonate/formalde resin, 2,4-dihydroxybenzoic acid/4-diazodiphenylamine.hexafluorophosphate/formal dehyde resin, 4-(p-hydroxyanilino)benzoic acid/4-diazodiphenylamine. hexafluorophosphate/formaldehyde resin, 3-methoxy-1,2-benzenedicarboxyli c acid/4-diazo-3-methyldiphenylamine.hexafluorophosphate/benzaldehyde resin, p-methoxybenzoic acid/4-diazodiphenylamine.hexafluorophosphate/formaldehyde resin, 2-methylbenzoic acid/4-diazodiphenylamine. hexafluorophosphate/formaldehyde resin, p-phenoxybenzoic acid/4-diazodiphenylamine.2-hydroxy-4-methoxybenzophenone-5-sulfonate/formal dehyde resin, 2,4-diaminobenzoic acid/4-diazodiphenylamine. hexafluorophosphate/formaldehyde resin, 2,4-dimethoxybenzoic acid/4-diazo-4'-methyldiphenylamine.hexafluorophosphate/formaldehyde resin, 4-carboxydiphenylamine/4-diazo-4'-ethyldiphenylamine.hexafluorophospha te/formaldehyde resin, 2,4-dimethoxybenzoic acid/4-diazodiphenylamine. hexafluorophosphate/formaldehyde resin, p-methoxybenzoic acid/4-diazodiphenylamine.-dodecylbenzenesulfonate/formaldehyde resin, 4-anilinobenzoic acid/4-diazodiphenylamine.methanesulfonate/formaldehyd e resin, p-phenoxybenzoic acid/4-diazo-4'-methyldiphenylamine. dodecylbenzenesulfonate/formaldehyde resin, 2,4-dihydroxybenzoic acid/4-diazodiphenylamine. dibutylnaphthalenesulfonate/formaldehyde resin, 4-carboxydiphenylamine/4-diazodiphenylamine.methanesulfonate/formaldehy de resin, phenoxyacetic acid/4-diazodiphenylamine.dodecylbenzenesulfon ate/formaldehyde resin, 4-anilinobenzoic acid/4-diazo-4'-methyldiphenylamine.hexafluorophosphate/formaldehyde resin and p-phenoxybenzoic acid/4-diazodiphenylamine.hexafluorophosphate/formaldeh yde resin.

Among these, preferred are salicylic acid/4-diazodiphenylamine. 2-hydroxy-4-methoxybenzophenone-5-sulfonate/formaldehyde resin, p-methoxybenzoic acid/4-diazodiphenylamine.dodecylbenzenesulfonate/form aldehyde resin, 2,4-dimethoxybenzoic acid/4- diazodiphenylamine.2-hydroxy-4-methoxybenzophenone-5-sulfonate/formaldehyde resin, 4-anilinobenzoic acid/4-diazodiphenylamine.methanesulfonate/formaldehyd e resin, p-phenoxybenzoic acid/4-diazo-4'-methyldiphenylamine. dodecylbenzenesulfonate/formaldehyde resin, 2,4-dihydroxybenzoic acid/4-diazodiphenylamine.dibutylnaphthalenesulfonate/formaldehyde resin, 4-carboxydiphenylamine/4-diazodiphenylamine.methanesulfonate/formaldehyde resin, 4-carboxy-4'-methoxydiphenylamine/4-diazodiphenylamine.2-hydroxy-4-methoxybenzophenone-5-sulfonate/formaldehyde resin, phenoxyacetic acid/4-diazodiphenylamine dodecylbenzenesulfonate/formaldehyde resin and phenoxyacetic acid/4-diazo-3-methoxy-diphenylamine. dodecylbenzenesulfonate/formaldehyde resin.

The molecular weight of the co-condensed diazo resin used in the invention may be adjusted by variously changing the molar ratio of the foregoing monomers and condensation conditions, but the resin should have a molecular weight ranging from about 400 to 100,000, preferably about 800 to 5,000 for effectively achieving the desired effect of the present invention.

The co-condensed diazo resin is added to the light-sensitive layer in an amount ranging from 0.1 to 30%, preferably 1 to 10% and more preferably 2 to 5% on the basis of the total weight of the layer.

The light-sensitive layer may further comprise, in addition to the foregoing co-condensed diazo resins, other diazo resins such as those disclosed in, for instance, J.P. KOKOKU Nos. Sho 47-1167, Sho 49-48001 and Sho 52-7364, J.P. KOKAI Nos. Sho 50-118802, Sho 59-222834, Hei 1-102456, Hei 1-102457, Hei 1-245246 and Hei 3-253857 and European Patent No. 0399755A.

Sensitizers used in the invention are preferably triplet sensitizers which have a maximum absorption peak which makes it possible for the resulting light-sensitive layer to sufficiently absorb light having a wavelength of not less than 300 nm.

Such sensitizers are, for instance, benzophenone derivatives, benzanthrone derivatives, quinones, aromatic nitro compounds, naphthothiazoline derivatives, benzothiazoline derivatives, thioxanthones, naphthothiazole derivatives, ketocumarin derivatives, benzothiazole derivatives, naphthofuranone compounds, pyrylium salts and thiapyrylium salts. Specific examples thereof include Michler's ketone, N,N'-diethylaminobenzophenone, benzanthrone, (3-methyl 1,3-diaza-1,9-benz)anthrone picramide, 5-nitroacenaphthene, 2-chlorothioxanthone, 2-isopropylthioxanthone, dimethylthioxanthone, methylthioxanthone-1-ethylcarboxylate, 2 nitrofluorene, 2-dibenzoylmethylene-3-methylnaphthothiazoline, 3,3-carbonyl-bis(7-diethylaminocumarin), 2,4,6-triphenylthiapyrylium perchlorate, 2-(p-chlorobenzoyl)naphthothiazole and those described in J.P. KOKOKU No. Sho 45-8832, J.P. KOKAI Nos. Sho 52-129791, Sho 62-294238 and Hei 2-173646, EP Nos. 0368327 and 0410654. These sensitizers are used in an amount ranging from about 1 to about 20% and preferably 3 to 10% on the basis of the total weight of the light-sensitive layer.

A-2. Light-Sensitive Layer Comprising Other Photocrosslinkable Polymers

Other photocrosslinkable polymers usable in the PS plate to which the method of the present invention can be applied are, for instance, those having cinnamyl group, cinnamoyl group, cinnamylidene group, cinnamylideneacetyl group and/or calcon group in the main chain or on the side chains thereof. Among these, photocrosslinkable polymers having light-sensitive cinnamoyl groups in the main chain are, for instance, light sensitive polyesters as disclosed in U.S. Pat. No. 3,030,208 and U.S. Pat. No. 4,942,109. The foregoing polyester can be prepared by condensing a proper polycarboxylic acid or a lower alkyl ester or chloride thereof with a proper polyhydric alcohol in the presence of an esterification catalyst.

Examples of these polymers which are made alkaline water-soluble are light-sensitive polymers obtained by reacting polyester prepolymers having photodimerizable unsaturated double bonds adjacent to aromatic nuclei in the main chain, side chain carboxyl groups and terminal hydroxyl groups with chain extenders having at least two functional groups capable of reacting with a hydroxyl group in the molecule such as diisocyanate compounds, diphenylterephthalate, diphenylcarbonate or terephthaloylbis(N-caprolactam) as disclosed in U.S. Pat. No. 4,640,887; and light-sensitive polymers obtained by reacting polyester prepolymers or polyurethane polymers having a photodimerizable unsaturated double bond adjacent to an aromatic nucleus in the main chain, and terminal hydroxyl groups with chain extenders such as pyromellitic dianhydride or cyclopentanetetracarboxylic acid dianhydride to thus introduce carboxyl groups in the side chains.

It is also possible to use alkaline water-soluble or swellable light-sensitive polymers having, on the side chains, photodimerizable functional groups and carboxyl groups and an acid value ranging from 20 to 200. These polymers are disclosed in, for instance, J.P. KOKAI Nos. Sho 62-175729, Sho 62-175730, Sho 63-25443, Sho 63-218944 and Sho 63-218945.

The photocrosslinkable polymers usable in the present invention desirably have a molecular weight of not less than 1,000, preferably 10,000 to 500,000, in particular 20,000 to 300,000.

The light-sensitive composition may comprise the foregoing photocrosslinkable polymers in an amount ranging from 10 to 99% and preferably 50 to 99% on the basis of the total weight of the composition.

It is preferred to incorporate a light-sensitive diazo resin into the light-sensitive layer comprising the photocrosslinkable polymer for enhancing the adhesion to a substrate. Examples thereof are diazo resins (I), (II) and (III) as will be discussed below.

The diazo resins may be incorporated into the light-sensitive layer in an amount ranging from 0.1 to 30% and preferably 1 to 10% on the basis of the total weight of the light-sensitive layer.

In this respect, other diazo resin such as those disclosed in J.P. KOKOKU Nos. Sho 47-1167 and Sho 52-7364 and J.P. KOKAI Nos. Sho 50-118802 and Sho 59-222834 in an amount of not more than 50% with respect to the foregoing diazo resins.

A-3: Light-Sensitive Layer Comprising Light-Sensitive Diazo Resin

Examples of light-sensitive diazonium compounds used in the light-sensitive layer comprising light-sensitive diazo resins are the following compounds (I), (II) and (III):

(I) Co-condensed diazo resins having repeating units derived from an aromatic compound having at least one member selected from the group consisting of carboxyl groups, phenolic hydroxyl groups, sulfonic acid residues, sulfinic acid residues and phosphorous-containing oxyacid residues and an aromatic diazonium compound represented by the foregoing general formula (C):

The aromatic rings of the foregoing aromatic compounds are preferably phenyl and naphthyl groups. The foregoing carboxyl groups, phenolic hydroxyl groups, sulfonic acid residues, sulfinic acid residues and/or phosphorus-containing oxyacid residues may be bonded to the aromatic rings directly or through a connecting group such as those having an ether bond and at least one carbon atom.

Specific examples of the aromatic compounds include benzoic acid, o-chlorobenzoic acid, m-chlorobenzoic acid, p-chlorobenzoic acid, phthalic acid, terephthalic acid, diphenylacetic acid, phenoxyacetic acid, p-methoxyphenylacetic aid, p-methoxybenzoic acid, 2,4-dimethoxybenzoic acid, 2,4-dimethylbenzoic acid, p-phenoxybenzoic acid, 4-anilinobenzoic acid, 4-(m-methoxyanilino)benzoic acid, 4-(p-methoxybenzoyl)-benzoic acid, 4-(p-methylanilino)benzoic acid, 4-phenylsulfonylbenzoic acid, phenol, (o, m, p)-cresol, xylenol, resorcin, 2-methylresorcin, (o, m, p)-methoxyphenol, m-ethoxyphenol, catechol, phloroglucin, p-hydroxyethylphenol, naphthol, pyrogallol, hydroquinone, p-hydroxybenzyl alcohol, 4-chlororesorcin, biphenyl 4,4'-diol, 1,2,4-benzenetriol, bisphenol A, 2,4-dihydroxybenzophenone, 2,3,4-trihydroxybenzophenone, p-hydroxyacetophenone, 4,4'-dihydroxydiphenyl ether, 4,4'-dihydroxydiphenylamine, 4,4'-dihydroxydiphenylsulfide cumylphenol, (o, m, p)-chlorophenol, (o, m, p)-bromophenol, salicylic acid, 4-methylsalicylic acid, 6-methylsalicylic acid, 4-ethylsalicylic acid, 6-propylsalicylic acid, 6-laurylsalicylic acid, 6-stearylsalicylic acid, 4,6-dimethylsalicylic acid, p-hydroxybenzoic acid, 2 methyl-4-hydroxybenzoic acid, 6-methyl-4-hydroxybenzoic acid, 2,6-dimethyl-4-hydroxybenzoic acid, 2,4-dihydroxybenzoic acid, 2,4-dihydroxy-6-methylbenzoic acid, 2,6-dihydroxybenzoic acid, 2,6 dihydroxy-4-methylbenzoic acid, 4-chloro-2,6-dihydroxybenzoic acid, 4-methoxy 2,6-dihydroxybenzoic acid, gallic acid, phloroglucin carboxylic acid, 2,4,5-trihydroxybenzoic acid, m-galloylgallic acid, tannic acid, m-benzoylgallic acid, m-(p-toluyl)gallic acid, protocatechuoyl-gallic acid, 4,6-dihydroxyphthalic acid, (2,4-dihydroxyphenyl)acetic acid, (2,6-dihydroxyphenyl)acetic acid, (3,4,5-trihydroxyphenyl)acetic acid, p-hydroxymethylbenzoic acid, p-hydroxyethylbenzoic acid, 4-(p-hydroxyphenyl)methylbenzoic acid, 4-(o-hydroxybenzoyl)benzoic acid, 4-(2,4-dihydroxybenzoyl)benzoic acid, 4-(p-hydroxyphenoxy)benzoic acid, 4-(p-hydroxyanilino)benzoic acid, bis(3-carboxy-4-hydroxyphenyl)amine, 4-(p-hydroxyphenylsulfonyl)-benzoic acid, 4-(p-hydroxyphenylthio)benzoic acid, benzenesulfonic acid, p-toluenesulfonic acid, benzenesulfinic acid, p-toluenesulfinic acid, aniline-2-sulfonic acid, 4-amino-m-toluenesulfonic acid, 2,5-diaminobenzenesulfonic acid, 1-naphthalenesulfonic acid, 1-amino-2-naphthalenesulfonic acid, 5-amino-2-naphthalenesulfonic acid, 7-amino 1,3-naphthalenedisulfonic acid, 2-amino-1,5-naphthalenedisulfonic acid, 2-sulfobenzoic acid (these sulfonic acids and sulfinic acids may be in the form of free acids, salts with metals such as sodium, potassium, lithium, cesium, calcium, barium, magnesium, alminum and zinc or substituted or unsubstituted ammonium salts), monophenylphosphate, monophenylphosphite, phenylphosphonic acid, phenylphosphous acid, monobenzylphosphate, monobenzylphosphite, benzylphosphonic acid, benzylphosphonous acid, mono(2-phenylethyl)phosphate, mono(2-phenylethyl)phosphite, mono(1-naphthyl)phosphate, mono(1-naphthyl)phosphite, 1-naphthylphosphonic acid, 1-naphthylphosphonous acid, and mono(2 naphthylphosphate.

Among these, particularly preferred are 4-methoxybenzoic acid, 3-chlorobenzoic acid, 2,4-dimethoxybenzoic acid, p-phenoxybenzoic acid, 4-anilinobenzoic acid, phenoxyacetic acid, phenylacetic acid, p-hydroxybenzoic acid, 2,4 dihydroxybenzoic acid, benzenesulfonic acid, p-toluenesulfinic acid, 1-naphthalenesulfonic acid, monophenylphosphate and phenylphosphonic acid.

(II) Diazo resins having at least one repeating unit represented by the following general formula (D):

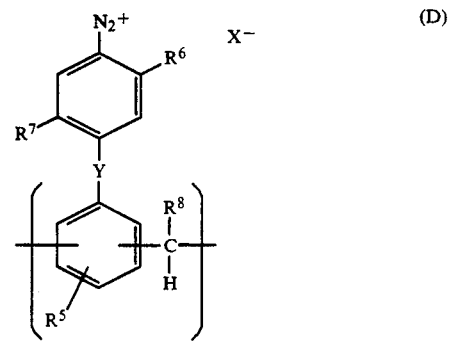

In the formula (D), $R^8$ represents a carboxyl group, a phenolic hydroxyl group, a sulfonic acid residue, a sulfinic acid residue or a phosphorus atom-containing oxyacid residue or a group having at least one of the foregoing groups and carbon atoms of not more than 15; and $R^5$, $R^6$, $R^7$, $X^-$ and Y are the same as those defined above in connection with the general formula (C).

(III) Diazo resins obtained by condensing aromatic diazonium compounds having at least one member selected from the group consisting of carboxyl groups, phenolic hydroxyl groups, sulfonic acid residues, sulfinic acid residues and phosphorous atom-containing oxyacid residues represented by the following general formula (E), (F) or (G) with aldehyde or ketone or an equivalent active carbonyl group-containing compound:

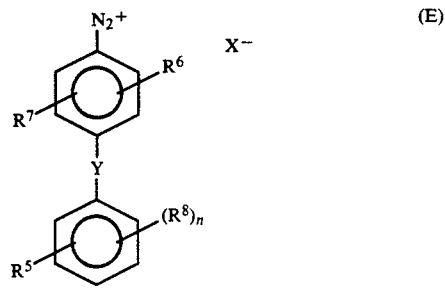

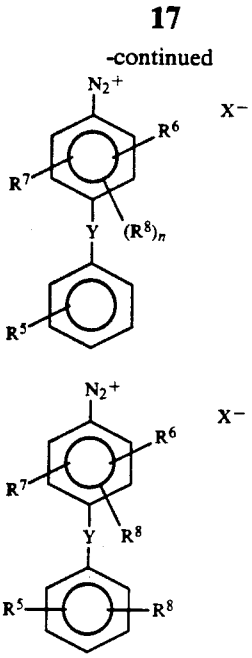

In the formulae (E), (F) and (G), $R^5$, $R^6$, $R^7$, $X^-$ and $Y$ are the same as those defined above in connection with the general formula (C) and $R^8$ is the same as that defined above in connection with the compound of the formula (D).

Particularly preferred counter anions $X^-$ of the diazo resins used in the invention are those derived from butylnaphthalenesulfonic acid, dibutylnaphthalenesulfonic acid, hexafluorophosphoric acid, 2-hydroxy 4-methoxybenzophenone-5-sulfonic acid and dodecylbenzenesulfonic acid.

The molecular weight of these diazo resins used in the invention may be adjusted by variously changing the molar ratio of each monomer and conditions for condensation, but desirably ranges from about 400 to 100,000, preferably from about 800 to 5,000.

The foregoing light-sensitive diazo resins are preferably used in combination with alkali soluble or swellable lipophilic polymers as binders.

Such lipophilic polymer compounds are, for instance, copolymers having repeating units derived from the following monomers (1) to (14) and a molecular weight ranging from 10,000 to 200,000.

(1) (meth)acrylamides, (meth)acrylic acid esters and hydroxystyrenes having an aromatic hydroxyl group, such as N (4-hydroxyphenyl) (meth)acrylamide, o-, m- or p-hydroxyphenyl (meth) acrylate and o-, m- or p hydroxystyrene;

(2) (meth)acrylic acid esters having an aliphatic hydroxyl group such as 2-hydroxyethyl (meth)acrylate;

(3) unsaturated carboxylic acids such as (meth)acrylic acid, maleic anhydride and itaconic acid;

(4) (substituted) alkyl acrylate such as methyl acrylate, ethyl acrylate, propyl acrylate, butyl acrylate, amyl acrylate, hexyl acrylate, octyl acrylate, 2-chloroethyl acrylate, glycidyl acrylate and N-dimethylaminoethyl acrylate;

(5) (substituted) alkyl methacrylate such as methyl methacrylate, ethyl methacrylate, propyl methacrylate, butyl methacrylate, amyl methacrylate, cyclohexyl methacrylate, 4-hydroxybutyl methacrylate, glycidyl methacrylate and N dimethylaminoethyl methacrylate;

(6) (meth)acrylamides such as acrylamide, methacrylamide, N-methylolacrylamide, N-methylolmethacrylamide, N-ethylacrylamide, N-hexylmethacrylamide, N-cyclohexylacrylamide, N-hydroxyethylacrylamide, N-phenylacrylamide, N-nitrophenylacrylamide and N-ethyl-N-phenylacrylamide;

(7) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(8) vinyl esters such as vinyl acetate, vinyl chloroacetate, vinyl butyrate and vinyl benzoate;

(9) styrenes such as α-methylstyrene and chloromethylstyrene;

(10) vinyl ketones such as methyl vinyl ketone, ethyl vinyl ketone, propyl vinyl ketone and phenyl vinyl ketone;

(11) olefins such as ethylene, propylene, isobutylene, butadiene and isoprene;

(12) N-vinylpyrrolidone, N-vinylcarbazole, 4-vinylpyridine, acrylonitrile, methacrylonitrile or the like;

(13) unsaturated imides such as maleimide, N-acryloylacrylimide, N-acetylmethacrylimide, N-propionylmethacrylimide and N (p-chlorobenzoyl) methacrylimide;

(14) unsaturated sulfonamides, for instance, methacrylamides such as N-(o-aminosulfonylphenyl)methacrylamide, N-(m-aminosulfonylphenyl) methacrylamide, N-(p-aminosulfonylphenyl)methacrylamide, N-(1-(3-aminosulfonyl)naphthyl)methacrylamide and N-(2-aminosulfonylethyl) methacrylamide; acrylamides having the same substituents as those listed above in connection with the methacrylamides; methacrylic acid esters such as o-aminosulfonylphenyl methacrylate, m-aminosulfonylphenyl methacrylate, p-aminosulfonylphenyl methacrylate and 1 (3-aminosulfonylnaphthyl) methacrylate and acrylic acid esters having the same substituents as those listed above in connection with the methacrylates.

Furthermore, it is also possible to copolymerize other monomers copolymerizable with the foregoing monomers. The copolymers obtained by the foregoing copolymerization can be modified with, for instance, glycidyl methacrylate and glycidyl acrylate. However, the present invention is not restricted to these specific examples at all.

Preferred are hydroxyl or sulfonamido group-containing copolymers having repeating units derived from the foregoing monomers (1), (2) and (14), in particular aromatic hydroxyl or sulfonamido group-containing copolymers.

The preferred copolymers comprise repeating units derived from the foregoing unsaturated carboxylic acids (3) and the carboxylic acid value thereof preferably ranges from 0 to 3 meq/g and more preferably 0.5 to 2.5 meq/g.

The molecular weight of the foregoing copolymer preferably ranges from 10,000 to 150,000.

The foregoing copolymers may optionally be used simultaneously with other resins such as polyvinyl butyral resins, polyurethane resins, polyamide resins, epoxy resins, novolak resins and natural resins.

These lipophilic polymerers are in general incorporated into the light-sensitive composition in an amount ranging from 40 to 99%, preferably 50 to 95% on the basis of the total weight of the composition. The above-mentioned light-sensitive diazo resins used in the present invention are incorporated into the light-sensitive composition in an amount usually ranging from 1 to 60% and preferably 3 to 40% on the basis of the total weight of the composition.

B. Positive-Working Light-Sensitive Layer

Light-Sensitive Layer Comprising o-Quinone Diazide Compound o-Quinone diazide compounds are those having at least one o-quinonediazido group in the molecule whose alkali-solubility is increased by the irradiation with actinic rays. Those having wide variety of structures may be used in the light-sensitive layer of this kind. These o-quinone diazide compounds are detailed in, for instance, J. Koser, Light-Sensitive Systems, pp. 339-352, published by John Wiley & Sons Inc. Particularly preferred are sulfonic acid esters or sulfonamides of o-quinone diazide obtained by reactions with a variety of aromatic polyhydroxy compounds or aromatic amine compounds.

Among o-quinone diazide compounds, most preferred are esters of benzoquinone-(1,2)-diazidosulfonic acid chloride or naphthoquinone-(1,2)-diazidosulfonic acid chloride with pyrogallol/acetone resins as disclosed in U.S. Pat. No. 3,635,709. Examples of other preferred o-quinonediazide compounds are esters of benzoquinone (1,2)-diazidosulfonic acid chloride or naphthoquinone-(1,2)-diazidosulfonic acid chloride with phenol/formaldehyde resins as disclosed in U.S. Pat. Nos. 3,046,120 and 3,188,210.

Besides, other useful examples of o-quinone diazide compounds are those disclosed in various patents such as J.P. KOKAI Nos. Sho 47-5303, Sho 48 63802, Sho 48 63803, Sho 48-96575, Sho 49-38701 and Sho 48-13354, J.P. KOKOKU Nos. Sho 41-11222, Sho 45-9610 and Sho 49-17481, U.S. Pat. Nos. 2,797,213, 3,454,400, 3,544,323, 3,573,917, 3,674,495 and 3,785,825, U.K. Patent Nos. 1,227,602, 1,251,345, 1,267,005, 1,329,888 and 1,330,932 and German Patent No. 854,890.

In the positive-working light-sensitive composition, these o-quinone diazide compounds may be used alone, but preferably used in combination with a binder. Preferred examples of the binder are novolak resins soluble in an aqueous alkaline solution. Typical examples of such novolak resins include phenol/formaldehyde resin, cresol/formaldeh yde resin, phenol/cresol/formaldehyde resin, p-tert butylphenol/formalde hyde resin and phenol-modified xylene resin. Examples of the binder further include polyvinyl compounds having phenolic hydroxyl groups such as polyhydroxy styrene polymers and copolymers thereof and halogenated polyhydroxystyrene polymers and copolymers thereof.

The amount of the o-quinone diazide compounds in the light-sensitive composition ranges from 10 to 50%, preferably 20 to 40% on the basis of the total weight of the composition. On the other hand, that of the phenolic resins to be incorporated into the composition ranges from 45 to 80% and preferably 50 to 70% on the basis of the total weight of the composition.

The light-sensitive layer of the negative-working PS plate to which the method of this invention is applied may also comprise binders which are generally selected from linear organic polymers. Specific examples of such binders are chlorinated polyethylene, chlorinated polypropylene, poly(alkyl acrylate), copolymers comprising repeating units derived from at least one monomer selected from the group consisting of alkyl acrylates, acrylonitrile, vinyl chloride, styrene and butadiene, polyamides, methyl cellulose, polyvinyl formal, polyvinyl butyral, methacrylic acid copolymers, acrylic acid copolymers and itaconic acid copolymers.

The light-sensitive layer may further comprise a dye. The dye is used for obtaining a visible image through exposure to light (exposed visible image) and/or that after development. Examples of preferred dyes are triphenylmethane type and diphenylmethane type ones, in particular victoria Pure Blue BOH. The dye is usually incorporated into the light-sensitive composition in an amount ranging from 1 to 5% on the basis of the total weight of th composition.

The light-sensitive layer may optionally comprise dyes or pigments for coloring the light-sensitive layer and printing out agents such as pH indicators, leuco dyes, agents for photolytically generating acids such as 1,2-naphthoquinone-(2)-diazido-4-sulfonic acid chloride, or diazonium salt monomers.

The light-sensitive layer preferably comprises a heat polymerization inhibitor and an antioxidant. Examples thereof useful in the invention are hydroquinone, p-methoxyphenol, di-t-butyl-p-cresol, pyrogallol, t-butylcatechol, benzoquinone, 4,4'-thiobis(3 methyl-6-t-butylphenol), 2,2'-methylenebis(4-methyl-6-t-butylphenol) and 2-mercaptobenzimidazole.

Further, a variety of additives can be added to the light-sensitive layer. Examples of such additives include alkyl ethers such as ethyl cellulose and methyl cellullose, fluorine atom-containing surfactants or nonionic surfactants, in particular fluorine atom-containing surfactants for improving the coating properties of the composition; plasticizers for imparting flexibility and wear resistance to the resulting film such as butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of (meth)acrylic acid, in particular tricresyl phosphate; agents for improving ink receptivity of image areas such as half-esterified products of styrene/maleic anhydride copolymer with alcohols as disclosed in J.P. KOKAI No. Sho 55-527, novolak resins such as PP-3121 and 50%-fatty acid ester of p-hydroxystyrene; stabilizers such as phosphoric acid, phosphorous acid and organic acids including citric acid, oxalic acid, dipicolinic acid, benzenesulfonic acid, naphthalenesulfonic acid, sulfosalicylic acid, 4-methoxy-2-hydroxybenzophenone-5-sulfonic acid and tartaric acid; developing accelerators such as higher alcohols and acid anhydrides; fillers; fluorine atom-containing compounds and silica compounds. The amount of these additives varies depending on the purpose of the resulting composition, but in general ranges from 0.01 to 30% on the basis of the total solid contents.

Moreover, the light-sensitive layer may comprise the same sensitizers as those listed above in connection with the light-sensitive layer comprising an alkaline water-soluble or swellable photocrosslinkable polymer having maleimido groups on the side chains and a co-condensed diazo resin having repeating units derived from an aromatic compound having at least one carboxyl group and an aromatic diazonium compound, in the same amount used above.

The aforementioned light-sensitive layer can be obtained by dissolving the light-sensitive composition comprising the aforementioned components in a solvent, for instance, 2-methoxyethanol, 2-methoxyethyl acetate, methyl cellosolve, propylene glycol monomethyl ether, 3-methoxypropanol, 3-methoxypropylacetate, acetone, methyl ethyl ketone, ethylene dichloride, methyl lactate, ethyl lactate, methanol, dimethylformamide, ethanol, methyl cellosolve acetate, diethylene glycol monoalkyl ether, diethylene glycol alkyl ether and mixture thereof and then applying the resulting solution on a substrate. In this respect, it is desirable to adjust the solid content of the solution of the light-sensitive composition to 1 to 50%. The amount of the solution to be coated ranges from about 0.1 to about 10 g/m$^2$, preferably 0.5 to 5 g/m$^2$ (weighed after drying).

In the present invention, an intermediate layer may optionally be formed between the substrate and the light sensitive layer for various purposes, for instance, for improving the adhesion therebetween, for ensuring complete removal of the light sensitive layer in a developer or for inhibiting halation. The intermediate layer may be formed from, for instance, diazo resins, phosphoric acid compounds capable of adhering to aluminum and silane coupling agents for improvement of the adhesion between the substrate and the light-sensitive layer; and polymers having high solubility and water-soluble polymer for ensuring complete dissolution of the light-sensitive layer. Further, the intermediate layer comprises a dye or a Uv absorber for inhibiting halation.

The thickness of the intermediate layer is not critical, but must be sufficient for uniformly forming linkages with the upper light-sensitive layer upon exposure to light. For this reason, it in general applied onto the substrate in an amount ranging from about 1 to 100 mg/m$^2$, in particular 5 to 40 mg/m$^2$ (weighed after drying).

The intermediate layer may comprise a co-condensed diazo resin or a photocrosslinkable polymer used in the light-sensitive layer. The amount of these additives ranges from 10 to 100%, preferably 30 to 100%, in particular 60 to 100%.

The intermediate layer may optionally comprise a sensitizer, a diazo stabilizer, a polymeric binder, a halation inhibitor, a surfactant or other additives.

The intermediate layer can be obtained by dissolving the foregoing components in a proper solvent at a desired concentration, then coating the resulting solution or dipping a substrate in the solution and drying the resulting film.

The surface of the light-sensitive layer may be matted for improving the adhesion to a film. The compounds and methods as disclosed in U.S. Pat. Nos. 4,557,994, 4,626,484, 5,006,442 and 5,028,512 can be used for such purpose.

Substrates having hydrophilic surface used in the present invention are desirably dimensionally stable plate-like materials. Such dimensionally stable plate-like materials are, for instance, those conventionally used as substrates for lithographic printing paltes which can suitably be used in the invention. Examples of such substrates are paper, paper laminated with a plastic film such as polyethylene, polypropylene and polystyrene films; metal plates such as aluminum, aluminum alloys, zinc and copper plates, plastic films such as cellulose diacetate, cellulose triacetate, cellulose propionate, cellulose acetate, cellulose acetate butyrate, cellulose nitrate, polyethylene terephthalate, polyethylene, polypropylene, polystyrene, polycarbonate and polyvinyl acetal films; and paper or plastic films laminated with sheets or foils of the foregoing metals or on which a layer of the foregoing metal is deposited. Among these, preferred are aluminum plates because of high dimensional stability, low cost and very high adhesion to the aforementioned light-sensitive layer or the like. Besides, it is also preferred to use a composite sheet such as polyethylene terephthalate film to which an aluminum sheet is adhered as disclosed in J.P. KOKOKU No. Sho 48-18327.

Metal substrates, in particular aluminum substrates are preferably subjected to surface treatments such as graining and anodization treatments.

These substrate are preferably treated by immersing them in an aqueous solution of sodium silicate, potassium fluorozirconate or a phosphate for improving the hydrophilicity of the surface thereof. Preferably used further include, for instance, aluminum plates which are treated by immersing in an aqueous solution of sodium silicate after graining as disclosed in U.S. Pat. No. 2,714.066; and those obtained by anodizing aluminum plates and then immersing them in an aqueous solution of an alkali metal silicate as disclosed in U.S. Pat. No. 3,181,461.

The silicate electrodeposition as disclosed in U.S. Pat. No. 3,658,662 is also effective as a surface treatment. Further, a combination of electrolytic graining as disclosed in J.P. KOKOKU No. Sho 46-27481 and J.P. KOKAI Nos. Sho 52-58602 and Sho 52-30503 with the foregoing anodization and sodium silicate treatment is also effective in the present invention.

The surface treatment which comprises, in order, brush graining, electrolytic graining, anodization and sodium silicate treatment as disclosed in U.S. Pat. No. 4,476,006. It is also preferred to use aluminum plates subjected to the foregoing surface treatments to which an underlying coating of a water-soluble resin such as polyvinylphosphon ic acid, a polymer or copolymer having sulfonic acid groups on the side chains or polyacrylic acid is applied. Preferred also include the surface treatments disclosed in J.P. KOKAI No. Hei 2-23318.

These hydrophilization treatments are carried out not only for making the substrate surface hydrophilic, but also for preventing detrimental reaction with the light-sensitive composition subsequently applied thereto and for improving the adhesion to the light-sensitive layer.

Imagewise exposure of these PS plates is performed using light sources rich in ultraviolet rays such as metal halide lamps and high pressure mercury lamps.

According to the present invention, there can be obtained a lithographic printing plate which does not cause background contamination, and has good printing durability and high sensitivity by developing a negative-working PS plate with a developer substantially free of organic solvents.

In other words, negative-working PS plates can be treated in the same manner conventionally used for treating positive working PS plates to give lithographic printing plates.

Thus, both negative- and positive-working PS plates can be treated with a single developer and a single automatic developing machine.

Moreover, if the developer replenisher according to the present invention is used in the method of the present invention, the method of the present invention can be performed without causing deterioration of the developing ability of the developer even when the development is repeated over a long time period and without forming any deposition at the bottom of the developing bath due to the light-sensitive resin components.

The present invention will hereinafter be explained in more detail with reference to the following non-limitative working Examples and the specific advantages of the present invention will also be discussed in detail in comparison with Comparative Examples given below.

EXAMPLE 1

An aluminum plate having a thickness of 0.30 mm was surface-grained with a nylon brush and an aqueous suspension of 400 mesh pumice stone and then sufficiently washed with water. The aluminum plate was etched by immersing it in a 10% solution of sodium hydroxide at 70° C. for 60 seconds, washed with running water, neutralized and washed with a 20% HNO, solution and then washed with water. Then the aluminum plate was subjected to electrolytic surface roughening treatment at a Va of 12.7 V, a quantity of anode time electricity of 160 coulomb/dm$^2$ in a 1% aqueous solution of nitric acid using a sinusoidal alternating waved current. At this stage, the surface roughness was determined to be 0.6μ (in terms of Ra unit). Subsequently, the aluminum plate was desmutted by immersing it in a 30% H$_2$SO$_4$ aqueous solution at 55° C. for 2 minutes and then anodized at a current density of 2 A/dm$^2$ for 2 minutes in a 20% H$_2$SO$_4$ aqueous solution till the thickness of the resulting anodized layer was 1.5 g/m$^2$. Then it was immersed in a 2.5% aqueous solution of sodium silicate maintained at 70° C. for one minutes, washed with water and dried. A light-sensitive composition I comprising the following components was applied onto the aluminum substrate thus obtained with a whirler in an amount of 1.5 g/m$^2$ (weighed after drying) and dried at 80° C. for 2 minutes to give a negative-working PS plate.

| Light-Sensitive Composition I | |
|---|---|
| Component | Amount (g) |
| Methy methacrylate/N-[6-(methacryloyloxy)hexyl]-2,3-dimethyl-maleimide/methacrylic acid (molar ratio = 10/60/30) copolymer [Mw = 3.5 × 10$^4$ (GPC); Tg = about 40° C. (DSC)] | 5 |
| Sensitizer I represented by the following structural formula: | 0.25 |

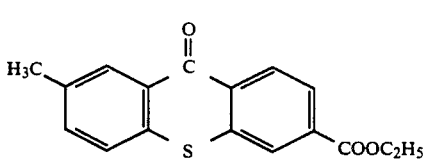

| | |
|---|---|
| Dodecylbenzenesulfonate of co-condensate of 4-diazodiphenyl-amine/phenoxyacetic acid/formaldehyde | 0.20 |
| Propylene glycol monomethyl ether | 50 |
| Methyl ethyl ketone | 50 |
| Megafack F-177 (fluorine atom-containing nonionic surfactant; available from Dainippon Ink and Chemicals, Inc.) | 0.03 |
| Victoria Pure Blue BOH (available from Hodogaya Chemical Co., Ltd.) | 0.10 |

The negative-working PS plate thus prepared was exposed to light through a negative film and a step wedge (density difference: 0.15, number of steps: 15) under vacuum. The exposure was performed by irradiating the PS plate with light rays from a 2 kW super high pressure mercury lamp for 60 seconds. Then the plate was developed with a 1.5% aqueous solution of potassium silicate whose molar ratio: [SiO$_2$]/[K] was 0.5 at 25° C. for 30 seconds. After water-washing, a gumming solution was applied thereto and printing was carried out with KORD Printing Press. As a result, 50,000 copies free of background contamination were obtained.

EXAMPLE 2

The same aluminum plate used in Example 1 which had been subjected to electrolytic surface-roughening treatment was then desmutted by immersing it in a 30% H$_2$SO$_4$ aqueous solution at 55° C. for 2 minutes and anodized at a current density of 2 A/dm$^2$ for 5 minutes so that the amount of the resulting anodized layer was 2.0 g/m$^2$ in a 20% H$_2$SO$_4$ aqueous solution. Then it was immersed in a 2.5% aqueous solution of sodium silicate maintained at 70° C. for one minutes, washed with water and dried. A light-sensitive composition II comprising the following components was applied onto the aluminum substrate thus obtained with a whirler in an amount of 1.5 g/m$^2$ (weighed after drying) and dried at 80° C. for 2 minutes to give a PS plate.

| Light-Sensitive Composition II | |
|---|---|
| Component | Amount (g) |
| N-[2-(methacryloyloxy)ethyl]-2,3-dimethylmaleimide/methacrylic acid (molar ratio 65/35) copolymer (Mw = 2.5 × 10$^4$) | 5 |
| Sensitizer II of the following formula: | 0.2 |

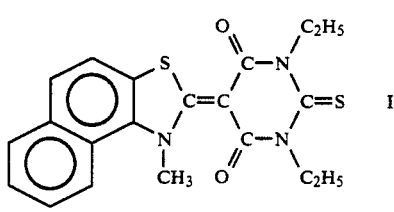

| | |
|---|---|
| Hexafluorophosphate of co-condensate of salicylic acid/4-diazo-3-methoxydiphenylamine/formaldehyde | 0.1 |
| 4-Diazodiphenylamine · hexafluorophosphate (diazonium salt monomer) | 0.03 |
| Phosphorous acid (50% aqueous solution) | 0.05 |
| Propylene glycol monomethyl ether | 50 |
| Methyl ethyl ketone | 50 |
| Megafack F-177 | 0.03 |
| Oil Blue #603 (available from Orient Chemical Industry, Inc.) | 0.15 |

Then the resulting negative-working PS plate was imagewise exposed to light in the same manner used in Example 1, developed with an automatic developing machine (PS800E; available from Fuji Photo Film Co., Ltd.) at 25° C. for 40 seconds using the following developer, followed by application of a gumming solution (FN-2; available from Fuji Photo Film Co., Ltd.).

Developer 2.0% Aqueous solution of potassium silicate having a molar ratio: [SiO$_2$]/[K] of 0.55 and containing 0.1% of a surfactant, Perex NBL (available from Kao Atlas Corporation).

Printing was performed using the resulting lithographic printing plate in the same manner used in Example 1 and 60,000 copies free of background contamination were obtained.

EXAMPLE 3

The following undercoat solution was applied onto the substrate which had been treated in the same manner used in Example 2 in an amount of 10 mg/m² (weighed after drying) and then dried.

Undercoat Solution

| Component | Amount (g) |
|---|---|
| C.I. Acid Yellow 25 | 0.25 |
| Methanol | 50 |
| Pure water | 100 |

Then the following light-sensitive composition III was applied onto the undercoat layer and dried in the same manner used in Example 1 to give a PS plate.

Light-Sensitive Composition III

| Component | Amount (g) |
|---|---|
| N-[6-(methacryloyloxy)hexyl]-2,3-dimethylmaleimide/methacrylic acid (molar ratio 70/30) copolymer (Mw = 8.0 × 10⁴) | 5.0 |
| Sensitizer of the following formula: | 0.3 |
| Butylnaphthalenesulfonate of co-condensate of benzoic acid/4-diazodiphenylamine/formaldehyde | 0.1 |
| 1,3-Bis(trichloromethyl)-5-phenyl-s-triazine | 0.1 |
| Malic acid | 0.05 |
| Phenylphosphonic acid | 0.05 |
| Oil Blue #603 (available from Orient Chemical Industry, Inc.) | 0.10 |
| Propylene glycol monomethyl ether | 50 |
| Methyl ethyl ketone | 30 |
| Methanol | 20 |
| Megafack F-177 | 0.03 |

Then the resulting negative-working PS plate was imagewise exposed to light in the same manner used in Example 1, developed with an automatic developing machine (PS9000; available from Fuji Photo Film Co. Ltd.) at 30° C. for 12 seconds using the following developer, followed by application of a gumming solution.

Developer 1.5% Aqueous solution of sodium silicate having a molar ratio: [SiO₂]/[Na] of 0.4.

Printing was performed using the resulting lithographic printing plate in the same manner used in Example 1 and 50,000 copies free of background contamination were obtained.

COMPARATIVE EXAMPLE 1

The imagewise exposed PS plate obtained in Example 1 was developed with an aqueous solution of potassium silicate having a molar ratio: [SiO₂]/[K] of 0.8. As a result, the non-image areas were insufficiently developed with the developer and deposited in the bath as sludge as the development proceeded.

EXAMPLES 4 TO 6

The following negative-working light-sensitive composition was prepared.

Negative-Working Light-Sensitive Composition

| Component | Amount (g) |
|---|---|
| Lipophilic polymeric compound (see Preparation Example 1) | 5.0 |
| Diazo resin 1 (see Preparation Example 2) | 0.6 |
| Victoria Pure Blue BOH (available from Hodogaya Chemical Co., Ltd.) | 0.1 |
| Julimer AC-10L (polyacrylic acid available from Nippon Junyaku Co., Ltd.) | 0.3 |
| Methyl cellosolve | 100 (ml) |

The light-sensitive composition was applied onto a substrate similar to that used in Example 1 in an amount of 1.7 g/m² (weighed after drying).

PREPARATION EXAMPLE 1

Preparation of Lipophilic Polymeric Compound

There were dissolved 53 g of N (4-hydroxyphenyl)-methacrylamide, 16 g of acrylonitrile, 30 g of methyl methacrylate, 8 g of ethyl acrylate, 2 g of methacrylic acid and 3.3 g of azobisisobutyronitrile in 220 ml of a 1:1 mixture of acetone/ethanol, followed by substitution with nitrogen and heating at 60° C. for 8 hours. After completion of the reaction, the reaction solution was poured into 5 l of water with stirring, the resulting white precipitates were filtered off and dried to give 90 g of a polymeric compound 1.

The molecular weight of the resulting lipophilic polymer 1 was determined by GFC (Gel Permeation Chromatography) and was found to be 29,000 (weight-average molecular weight).

PREPARATION EXAMPLE 2

Preparation of Diazo Resin 1

There were dissolved 3.5 g (0.025 mole) of p-hydroxybenzoic acid and 7.1 g (0.025 mole) of 4-diazodiphenylamine sulfate in 90 g of concentrated sulfuric acid under water cooling. After the reaction, 2.7 g (0.09 mole) of paraformaldehyde was gradually added to the reaction system. The addition was performed in such a manner that the reaction temperature did not exceed 10° C. Thereafter, the reaction system was stirred for 2 hours under ice-cooling. The reaction mixture was poured into 1 l of ethanol with ice-cooling and the resulting precipitates were taken by filtration. After washing the precipitates with ethanol, the precipitates were dissolved in 200 ml of pure water and a cold concentrated aqueous solution containing 10.5 g of zinc chloride was added thereto. The resulting precipitates were taken by filtration, washed with ethanol and dissolved in 300 ml of pure water. To the solution, there was added a cold concentrated aqueous solution containing 28.7 g of sodium dibutylnaphthalenesulfonate. The precipitates formed were taken by filtration, washed with water and dried at 30° C. over a whole day and night to give Diazo resin 1. The molecular weight of Diazo resin 1 was determined to be about 1,600 in terms of weight-average molecular weight.

PREPARATION EXAMPLE 3

Preparation of Diazo Resin 2

There were dissolved 6.1 g (0.040 mole) of phenoxyacetic acid and 11.3 g (0.040 mole) of 4-diazodiphenylamine sulfate in 90 g of concentrated sulfuric acid under water cooling. After the reaction, 3.0 g (0.10 mole) of paraformaldehyde was gradually added to the reaction system. The addition was performed in such a manner that the reaction temperature did not exceed 10° C. Thereafter, the reaction system was stirred for 2 hours under ice-cooling. The reaction mixture was poured into 1 l of ethanol with ice-cooling and the resulting precipitates were taken by filtration. After washing the precipitates with ethanol, the precipitates were dissolved in 200 ml of pure water and a cold concentrated aqueous solution containing 10.5 g of zinc chloride was added thereto. The resuting precipitates were taken by filtration, washed with ethanol and dissolved in 300 ml of pure water. To the solution, there was added a cold concentrated aqueous solution containing 41 g of sodium dibutylnaphthalenesulfonate. The precipitates formed were taken by filtration, washed with water and dried at 30° C. over a whole day and night to give Diazo resin 2. The molecular weight of Diazo resin 2 was determined by GPC and found to be about 2,300 in terms of weight-average molecular weight.

COMPARATIVE PREPARATION EXAMPLE

Preparation of Diazo Resin 3

There was dissolved 14.5 g (50 mM) of p-diazophenylamine sulfate in 40.9 g of concentrated sulfuric acid with ice-cooling. To the resulting solution, there was gradually added 1.5 g (50 mM) of paraformaldehyde. The addition was performed in such a manner that the reaction temperature did not exceed 10° C. Thereafter, the mixture was stirred for 2 hours with ice-cooling.

The reaction mixture was poured into 500 ml of ethanol with ice-cooling and the resulting precipitates were taken by filtration. After washing with ethanol, the precipitates were dissolved in 100 ml of pure water and a cold concentrated aqueous solution containing 6.8 g of zinc chloride was added to the solution. The resulting precipitates were taken by filtration, washed with ethanol and dissolved in 150 ml of pure water. To the solution, there was added a cold concentrated aqueous solution containing 8 g of ammonium hexafluorophosphate. The resulting precipitates were taken by filtration, washed with water and dried at 30° C. over a whole day and night to give Diazo resin 3.

The molecular weight of Diazo resin 3 was determined by GPC and found that the resin comprised about 50 mole% of 5-mer or higher polymers.

Moreover, the following positive-working light-sensitive composition was prepared.

| Positive-Working Light-Sensitive Composition | |
|---|---|
| Component | Amount (g) |
| Ester compound of naphthoquinone-1,2-diazido-5-sulfonic acid chloride and pyrogallol/acetone resin (Note 1) | 0.90 |
| Cresol/formaldehyde resin | 1.70 |
| t-Butylphenol/formaldehyde resin (Note 2) | 0.05 |
| Naphthoquinone-1,2-diazido-4-sulfonic acid chloride | 0.03 |
| Tetrahydrophthalic anhydride | 0.20 |
| Oil Blue #603 (blue dye available from Orient Chemical Industry, Inc.) | 0.05 |
| Methyl ethyl ketone | 8 |
| Ethylene glycol monomethyl ether | 15 |

Note 1: Compound disclosed in Example 1 of U.S. Pat. No. 3,635,709.
Note 2: Compound disclosed in U.S. Pat. No. 4,123,279.

The light-sensitive composition was applied onto a substrate which was identical with that used in Example 1 except that it was not treated with sodium silicate in an amount of 2 g/m$^2$ (weighed after drying).

These negative- and positive-working PS plates were imagewise exposed to light from a 1.5 kW metal halide lamp at a distance of 70 cm and then 200 m$^2$ of the PS plates were processed with an automatic developing machine 900 D (available from Fuji Photo Film Co., Ltd.) at 30° C. for 12 second (the ratio of the processed negative-working PS plate to the processed positive working PS plate (N/P ratio) was 3/7) using Developer A and Replenisher B, C and D as shown in Table 1. The supplementation of the developer was performed in accordance with the method disclosed in U.S. Pat. No. 4,882,246.

TABLE 1

| Developer (Dev.) and Replenisher (Rep.) | Dev. A | Rep. B (Ex. 4) | Rep. C (Ex. 5) | Rep. D (Ex. 6) |
|---|---|---|---|---|
| Molar Ratio [SiO$_2$]/[K] (potassium silicate; available from Nippon Chemical Industry Co., Ltd.) | 0.55 | 0.24 | 0.55 | 0.12 |
| SiO$_2$ Content (% by weight) | 2.5 | 1.0 | 2.8 | 1.5 |
| Surfactant* | — | 0.01 | 0.01 | 0.01 |

*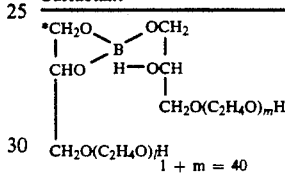

$$CH_2O(C_2H_4O)_lH \quad l + m = 40$$

As a result, in Example 4, the developability for negative and positive-working PS plates was not impaired even after 200 m$^2$ thereof was processed and any background contamination was observed during printing. In addition, any deposit was not observed at the bottom of the developing bath. On the other hand, in Example 5, the developability for negative-working PS plates, in particular aged PS plates, was found to be impaired and it wa also found that background contamination was observed to some extent during printing when the amount of water was reduced even for non-aged PS plates. In addition, there was observed a small amount of viscous resin-like deposits at the bottom of the developing bath. Further, in Example 6, both negative- and positive-working PS plates were well-developed and there was not observed any background contamination during printing. However, the image portion of the positive-working PS plate began to be attacked to give unstable images when the developing time reached to twice of the standard time. Further, the non-image area of the positive-working PS plate began to slightly cause foaming and to be dissolved.

The foregoing indicates that the ratio: [SiO$_2$/[M] of the replenisher for treating both negative- and positive-working PS plates preferably ranges from 0.15 to 0.50.

EXAMPLES 7 TO 9

A positive-working light-sensitive layer similar to that used in Example 4 and a light-sensitive layer of the following negative-working light-sensitive composition were applied onto the same substrates used in Example 4 provided that the substrate for positive-working PS plate was not treated with sodium silicate to give PS plates.

| Negative-working Light-Sensitive Composition | |
|---|---|
| Component | Amount (g) |
| Methyl methacrylate/N-[2-(methacryloyloxy)ethyl]-2,3-dimethylmaleimide/methacrylic acid (molar ratio = 10/60/30) copolymer | 5 |
| Sensitizer having the following formula: | 0.25 |

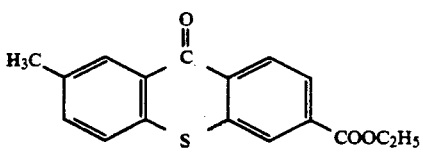

| | |
|---|---|
| Diazo resin 1 (see Preparation Example 2) | 0.1 |
| Propylene glycol monomethyl ether | 50 |
| Methyl ethyl ketone | 50 |
| Megafack F-177 (fluorine atom-containing surfactant; available from Dainippon Ink and Chemicals, Inc.) | 0.03 |
| Copper phthalocyanin pigment (CI Pigment Blue 15), to which 10% of a plasticizer is dispersed | 1.0 |

The light-sensitive compositions were applied onto the substrates with a whirler in an amount of 1.5 g/m² (weighed after drying).

These negative- and positive-working PS plates were imagewise exposed, for 45 seconds, to light from a 30 A carbon arc lamp at a distance of 70 cm and then 250 m² of the PS plates were processed with an automatic developing machine 900D (available from Fuji Photo Film Co., Ltd.) at 30° C. for 12 second (the N/P ratio was 50/50) using Developer E and Replenishers F, G and H as shown in Table 2. The supplementation of the developer was performed in the same manner used in Example 4.

TABLE 2

| Developer (Dev.) and Replenisher (Rep.) | Dev. E | Rep. F (Ex. 7) | Rep. G (Ex. 8) | Rep. H (Ex. 9) |
|---|---|---|---|---|
| Molar Ratio [SiO₂]/[K] + [Na] (50% + 50%) | 0.6 | 0.3 | 0.4 | 0.2 |
| SiO₂ Content (% by weight) | 2.0 | 1.5 | 3.5 | 0.5 |
| 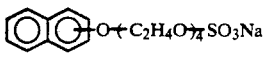 | — | 0.05 | 0.05 | 0.05 |

As a result, in Example 7, the developability for negative- and positive-working PS plates was not impaired even after 250 m² thereof was processed and any background contamination was observed during printing. In addition, any deposit was not observed at the bottom of the developing bath even when the developer was allowed to stand for several days after the processing. On the other hand, in Example 8, the developability for negative-working PS plates was began to be deteriorated at the time when 100 m² of the PS plates were processed and background contamination was observed. In addition, deposits were observed at the bottom of the developing bath when the developer was allowed to stand for several days after the processing of 250 m²/l of the PS plates. Further, in Example 9, the negative-working PS plates were well developed, but the positive-working PS plates were insufficiently developed and conspicuous background contamination was observed during printing.

The foregoing indicates that the SiO₂ content of the replenisher for treating both negative and positive-working PS plates preferably ranges from 1.0 to 3.0% by weight.

EXAMPLES 10 TO 12

A negative working light-sensitive layer similar to that used in Example 4 and a light-sensitive layer of the following positive-working light-sensitive composition were applied onto the same substrates used in Example 4 provided that the substrate for positive-working PS plate was not treated with sodium silicate to give PS plates.

| Positive-Working Light-Sensitive Composition | |
|---|---|
| Component | Amount (g) |
| Naphthoquinone-1,2-diazido-5-sulfonic acid ester of polyhydroxyphenyl compound obtained by condensation of acetone and pyrogallol (compound disclosed in Example 1 of U.S. Pat. No. 3,635,709) | 0.8 |
| Novolak type m-/p- mixed cresol/formaldehyde resin | 2.2 |
| Novolak type octylphenol/formaldehyde resin | 0.02 |
| Phthalic anhydride | 0.08 |
| 2-Trichloromethyl-5-(p-methoxystyryl)-1,3,4-oxadiazole | 0.04 |
| p-Toluenesulfonate of Crystal Violet | 0.03 |
| Methyl cellosolve acetate | 20 |
| Methyl ethyl ketone | 8 |

The light-sensitive compositions were applied onto the substrates with a whirler in an amount of 2.0 g/m² (weighed after drying).

These negative- and positive working PS plates were imagewise exposed to light using PS Light (provided with a 2 kW metal halide lamp; available from Fuji Photo Film Co., Ltd.) and then 300 m² of the PS plates were processed with an automatic developing machine 900D (available from Fuji Photo Film Co., Ltd.) at 30° C. for 12 second (the N/P ratio was 7/3) using Developer I and Replenishers J, K and L as shown in Table 3. The supplementation of the developer was performed in the same manner used in Example 4.

TABLE 3

| Developer (Dev.) and Replenisher (Rep.) | Dev. I | Rep. J (Ex. 10) | Rep. K (Ex. 11) | Rep. L (Ex. 12) |
|---|---|---|---|---|
| Molar Ratio [SiO₂]/[K] | 0.65 | 0.18 | 0.60 | 0.50 |
| SiO₂ Content (% by weight) | 2.0 | 1.2 | 1.5 | 0.30 |
| Surfactant* | — | 0.05 | 0.05 | 0.05 |

*Amorgen K (N-tetradecyl-N,N-dihydroxyethyl betaine; available from Dai-ichi Kogyo Seiyaku Co., Ltd.)

As a result, in Example 10, the developability for negative- and positive working PS plates was not impaired even after 300 m² thereof was processed and any background contamination was observed during printing. In addition, any deposit was not observed at the bottom of the developing bath even when the developer was allowed to stand for several days after the processing. On the other hand, in Example 11, the developability for the negative-working PS plates, in particular those subjected to forced thermal aging was deteriorated and it was found that background contamination was observed when the amount of water was reduced. Further, in Example 12, the negative-working PS plates were well-developed, but the positive-working PS plates were insufficiently developed and conspicuous background contamination was observed during printing.

The foregoing indicates that the molar ratio: [SiO₂]/[M] and the SiO₂ content of the replenisher for treating both negative- and positive-working PS plates preferably range from 0.15 to 0.50 and from 1.0 to 3.0% by weight, respectively.

EXAMPLE 13

A negative-working PS plate α was prepared in the same manner used in Example 4. Moreover, the same procedures used in Example 4 were repeated except that Diazo resins 2 and 3 were substituted for the diazo resin used in Example 4 to give negative-working PS plates β and γ.

These negative-working PS plates were imagewise exposed to light from a 1.5 kW metal halide lamp at a distance of 70 cm and 100 m² of the PS plates were then developed at 30° C. for 12 seconds with an automatic developing machine 900D (available from Fuji Photo Film Co., Ltd) using Developer A and Replenishers B, C and D used in Examples 4, 5 and 6.

The supplementation of the developer was performed according to the method disclosed in U.S. Pat. No. 4,882,246. The resulting lithograhic printing plates were put on a printing press SOR-M available from Heidelberg Company and printing was performed.

The results obtained are summarized in the following Table 4.

TABLE 4

| | Negative -Working PS Plate | Replenisher Used | Peeling of Image area | Deposit at the Bottom of the Bath | Background Contamination During printing |
| --- | --- | --- | --- | --- | --- |
| Ex. | α | B | None | None | None |
| Ex. | β | B | None | None | None |
| Comp. Ex. | α | C | None | observed | observed |
| Comp. Ex. | α | D | observed | None | None |
| Comp. Ex. | β | C | None | observed | observed |
| Comp. Ex. | γ | B | None | None | Observed |
| Comp. Ex. | γ | D | observed | None | observed |

As seen from Table 4, when the negative-working PS plate which comprised a diazo resin having carboxyl groups such as Diazo resin 1 or 2 was processed by the developing method in which Replenisher B of the present invention was used, good results could be obtained without causing peeling of image area, formation of deposits at the bottom of the developing bath and background contamination during printing.

However, when the Replenisher C having a high molar ratio: [SiO₂]/[M] was used, deposits were formed at the bottom of the developing bath and background contamination was observed. On the other hand, when the Replenisher D having a low molar ratio: [SiO₂]/[M] was used, the image area was peeled off from the substrate. Moreover, the negative-working PS plate which comprised Diazo resin 3 of Comparative Preparation Example was not sufficiently developed and background contamination was observed.

What is claimed is:

1. A method for preparing lithographic printing plates comprising the steps of imagewise exposing, to light, negative-working presensitized plates for use in making a lithographic printing plate which comprises a substrate provided thereon with a light-sensitive layer comprising co-condensed diazo resins comprising repeating units derived from an aromatic compound having at least one member selected from the group consisting of carboxyl groups, phenolic hydroxyl groups, sulfonic acid residues, sulfinic acid residues and phosphorus atom-containing oxyacid residues and those derived from an aromatic diazonium compound represented by the following general formula (C);

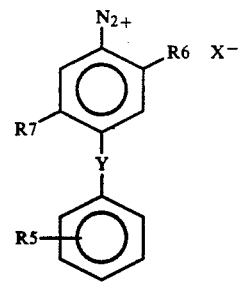

wherein $R^5$ represents a hydrogen atom, an alkyl group, an alkoxy group, a hydroxyl group, a carboxyester group or a carboxyl group; $R^6$ represents a hydrogen atom, an alkyl group or an alkoxy group, $R^7$ represents a hydrogen atom, an alkyl group or an alkoxy group; X represents an anion; and Y represents —NH—, —O—, or —S—; and developing the imagewise exposed presensitized plates by repeatedly using a predetermined volume of a developer which comprises an aqueous solution of an alkali metal or ammonium silicate having a ratio; (SiO₂)/(M), where (SiO₂) and (M) represent the molar concentrations of SiO₂ and the alkali metal or ammonium in the developer respectively, ranging from 0.15 to 0.75 and an SiO₂ content ranging from 1.0 to 4.0% by weight on the basis of the total weight of the developer to remove the unexposed portion of the light-sensitive layer, wherein, the activity of the developer deteriorated through the development is compensated by addition of a replenisher which comprises an aqueous solution of an alkali metal or ammonium silicate having a molar ratio: (SiO₂)/(M) ranging from 0.15 to 0.50 and an SiO₂ content ranging from 1.0 to 3.0% by weight on the basis of the total weight of the replenisher.

2. The method of claim 1 wherein the molar ratio (SiO₂)/(M) of the developer ranges from 0.25 to 0.75.

3. The method of claim 1 wherein the SiO₂ content of the developer is 1.0 to 3.0% by weight on the basis of the total weight the developer.

4. The method of claim 1 wherein the alkali metal or ammonium silicate included in the developer and the replenisher is sodium silicate, potassium silicate, lithium silicate or ammonium silicate.

5. The method of claim 1 wherein the developer and the replenisher comprise at least one alkaline agent selected from the group consisting of potassium hydroxide, sodium hydroxide, lithium hydroxide, sodium tertiary phosphate, sodium secondary phosphate, ammonium tertiary phosphate, ammonium secondary phosphate, sodium metasilcate, sodium bicarbonate, sodium borate, ammonium borate, ammonia, monomethylamine, dimethylamine, trimethylamine, monoethylamine, diethylamine, triethylamine, monoisopropylamine, diisopropylamine, n-butylamine, monoethanolamine, diethanolamine, triethanolamine, monoisopropanolamine, diisopropanolamine, ethyleneimine, ethylenediamine and pyridine.

6. The method of claim 1 wherein the developer and the replenisher comprise a surfactant in an amount of not more than 5% by weight.

7. The method of claim 1 wherein the developer and the replenisher comprise an organic solvent in an amount ranging from 1-5% by weight.

8. The method of claim 1 wherein the developer and the replenisher comprise at least one additive selected from the group consisting of alkali-soluble mercapto compounds, alkali-soluble thioether compounds, water-soluble reducing agents, anti-foaming agents and agents for softening hard water.

9. The method of claim 1 wherein the light-sensitive layer comprises an alkaline water-soluble or swellable photocrosslinkable polymer carrying maleimido groups on the side chains, a sensitizer and a co-condensed diazo resin which comprises repeating units derived from an aromatic compound having at least one carboxyl group and those derived from an aromatic diazonium compound.

10. The method of claim 1 wherein the light-sensitive layer comprises a photocrosslinkable polymer carrying, in the main chain or on the side chains, cinnamyl groups, cinnamoyl groups, cinnamylidine groups, cinnamylideneacetyl groups or calcon groups.

11. The method of claim 1 wherein the light-sensitive layer further comprises an alkaline water-soluble or swellable, lipophilic polymer compound.

* * * * *